(12) United States Patent
Arai

(10) Patent No.: US 7,567,126 B2
(45) Date of Patent: Jul. 28, 2009

(54) VARIABLE GAIN AMPLIFIER AND CONTROL METHOD THEREOF

(75) Inventor: Tomoyuki Arai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/058,354

(22) Filed: Mar. 28, 2008

(65) Prior Publication Data

US 2008/0180175 A1   Jul. 31, 2008

Related U.S. Application Data

(63) Continuation of application No. PCT/JP2005/018181, filed on Sep. 30, 2005.

(51) Int. Cl.
*H03G 3/10* (2006.01)
(52) U.S. Cl. .................. 330/285; 330/296
(58) Field of Classification Search ............ 330/296, 330/285, 278
See application file for complete search history.

(56) References Cited

U.S. PATENT DOCUMENTS 5,392,004 A * 2/1995 Masliah ................ 330/296
5,831,476 A * 11/1998 Buer et al. ................ 330/2
6,771,124 B1 * 8/2004 Ezell ...................... 330/129
6,842,075 B2 * 1/2005 Johnson et al. .......... 330/296
7,257,382 B2 * 8/2007 Arai et al. ................ 455/91

FOREIGN PATENT DOCUMENTS

| JP | 61-206322 A | 9/1986 |
| JP | 4-361412 A | 12/1992 |
| JP | 04-361412 A | 12/1992 |
| JP | 2005-159803 A | 6/2005 |

* cited by examiner

*Primary Examiner*—Henry K Choe
(74) *Attorney, Agent, or Firm*—Fujitsu Patent Center

(57) ABSTRACT

A variable gain amplifier has a first amplifier circuit (106) having a first field-effect transistor and amplifying a signal input to a gate of the first field-effect transistor to output; a gate bias control circuit (102) controlling a gate bias of the first amplifier circuit to control a gain of the first amplifier circuit; and a variable matching circuit (103) controlling a capacitor connected to the gate of the first amplifier circuit to control the gain of the first amplifier circuit.

20 Claims, 5 Drawing Sheets

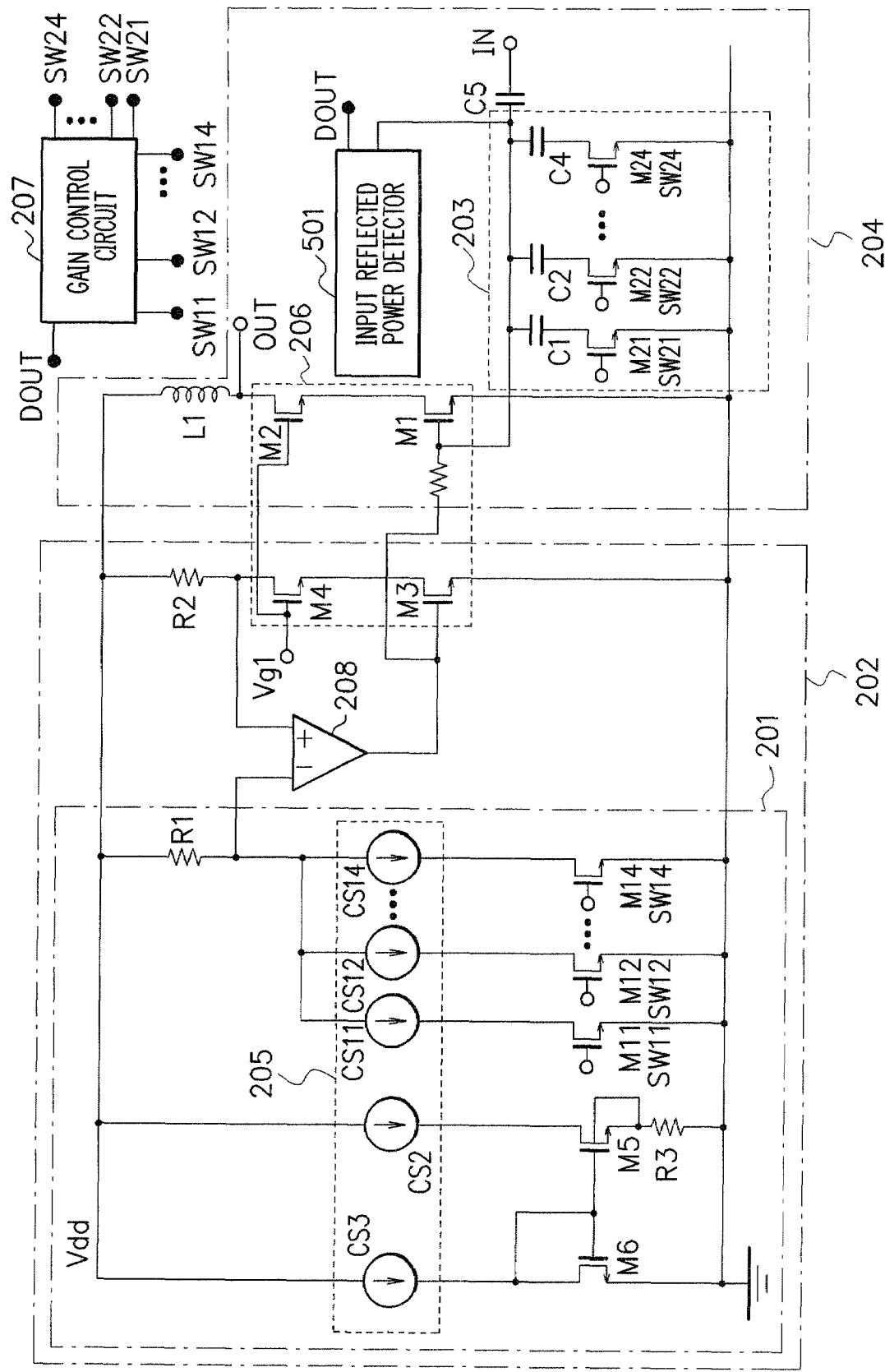
F I G. 5

VARIABLE GAIN AMPLIFIER AND CONTROL METHOD THEREOF

CROSS-REFERENCE TO RELATED APPLICATION

This application is a continuation of Application No. PCT/JP2005/018181, filed Sep. 30, 2005, the entire specification claims and drawings of which are incorporated herewith by reference.

TECHNICAL FIELD

The present invention relates to a variable gain amplifier and a control method of the variable gain amplifier.

BACKGROUND ART

FIG. 7 is a circuit diagram showing a gain controllable high-frequency amplifier circuit descried in later-mentioned Patent Document 1. A field-effect transistor 701 amplifies input signals, which are input to a gate. A gain can be controlled by controlling on and off of switches B1 to Bn and controlling a connection of an attenuation capacitor.

In other words, a gain control is executed by controlling an input power. This input power control employs a capacitor control not to lead noise figure (S/N) deterioration in the amplifier circuit. However, when the capacitor of the input of the amplifier circuit changes, it causes a change in an input impedance of the amplifier circuit and an impedance mismatch with a previous circuit is generated. It has been a problem since this causes a linear deterioration of the amplifier circuit.

SUMMARY OF THE INVENTION

According to an aspect of the present invention, a variable gain amplifier has a first amplifier circuit having a first field-effect transistor and amplifying a signal input to a gate of the first field-effect transistor to output; a gate bias control circuit controlling a gate bias of the first amplifier circuit to control a gain of the first amplifier circuit; and a variable matching circuit controlling a capacitor connected to the gate of the first amplifier circuit to control the gain of the first amplifier circuit.

BRIEF DESCRIPTION OF THE DRAWINGS

FIG. 5 is a circuit diagram showing a configuration of a variable gain amplifier according to a second embodiment of the present invention;

DETAILED DESCRIPTION OF THE PREFERRED EMBODIMENTS

First Embodiment

Figure 1:
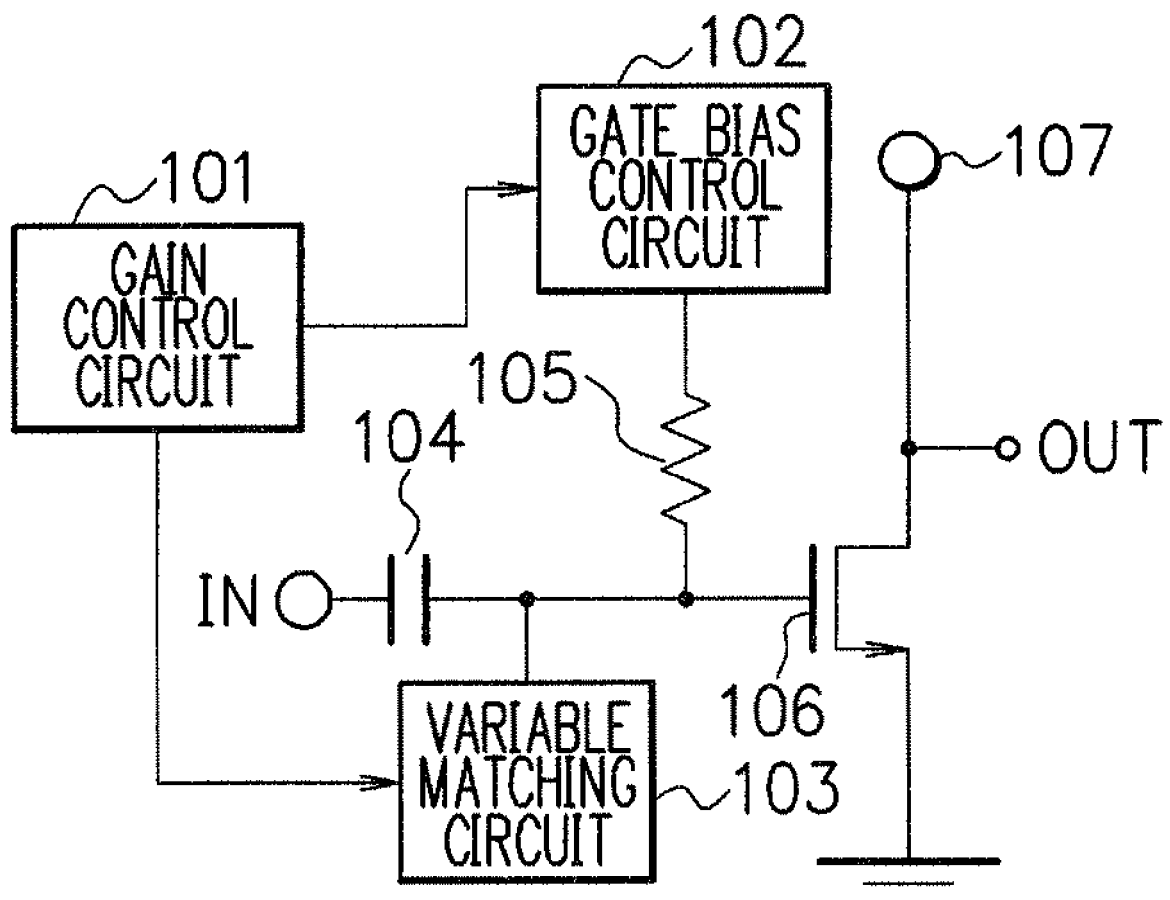
FIG. 1 is a block diagram showing a configuration of a variable gain amplifier according to a first embodiment of the present invention.

FIG. 1 is a block diagram showing a configuration of a variable gain amplifier according to a first embodiment of the present invention. Hereinafter, an MOS field-effect transistor is simply referred to as a transistor. An n channel transistor 106 has a gate connected to an input terminal IN via a capacitor 104, a drain connected to a power supply voltage terminal 107, and a source connected to a ground terminal. An output terminal OUT is connected to the drain of the transistor 106. A gain control circuit 101 controls a gate bias control circuit 102 and a variable matching circuit 103 according to a gain of the variable gain amplifier. The gate bias control circuit 102 is connected to the gate of the transistor 106 via a resistor 105. The variable matching circuit 103 is connected to the gate of the transistor 106.

The transistor 106 constitutes an amplifier circuit, amplifies high frequency input signals (RF input signals), which are input to the input terminal IN, and outputs the signals from the output terminal OUT. The gate bias control circuit 102 controls a gate bias of the transistor 106 to control a gain of the amplifier circuit. The variable matching circuit 103 controls the capacitor connected to the gate of the transistor 106 to control the gain of the amplifier circuit.

Figure 2:
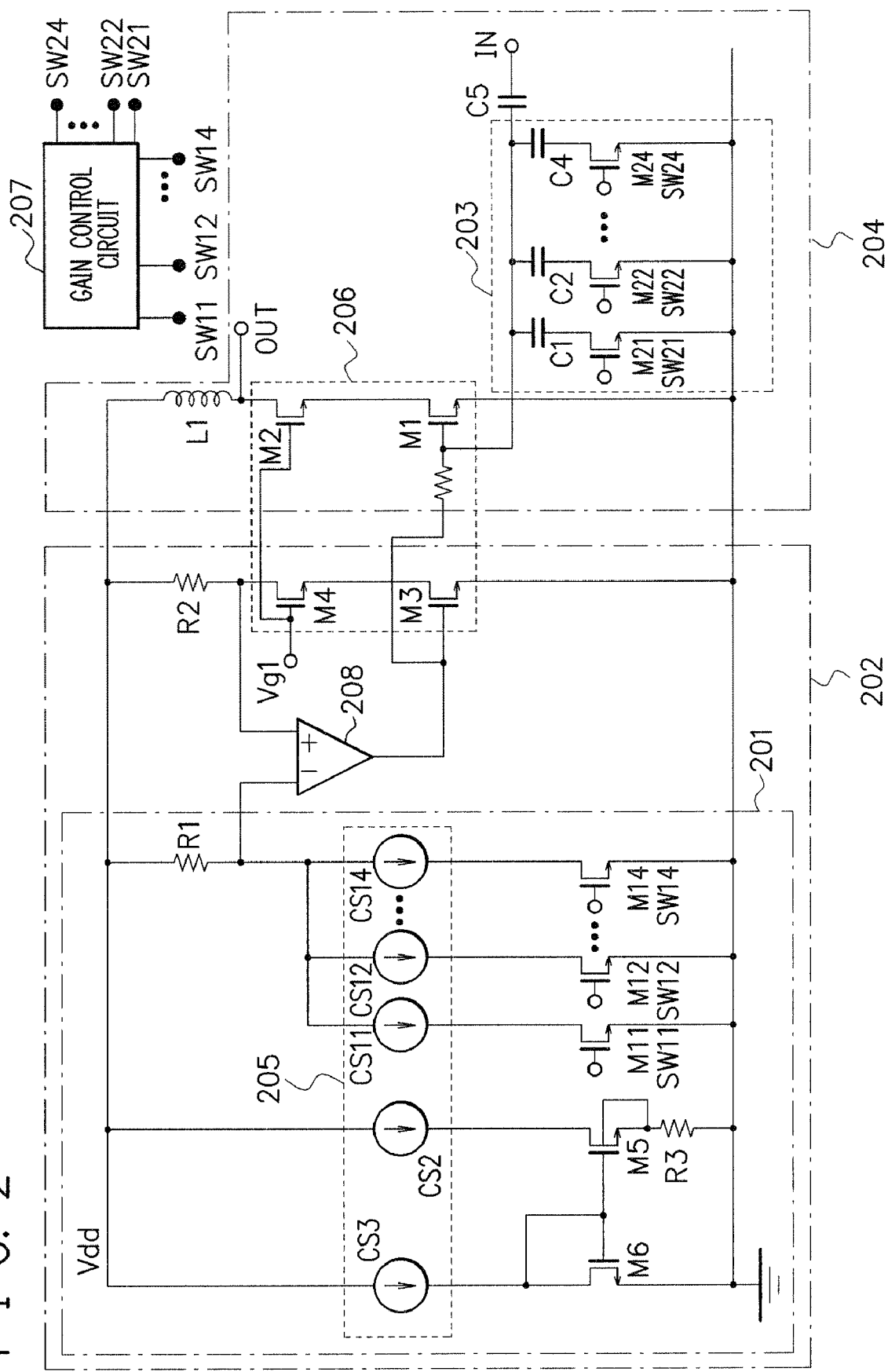
FIG. 2 is a circuit diagram showing a configuration of the variable gain amplifier according to the first embodiment.

FIG. 2 is a circuit diagram showing a configuration of the variable gain amplifier according to the present embodiment. A gain control circuit 207 corresponds to the gain control circuit 101 of FIG. 1, a gate bias control circuit 202 corresponds to the gate bias control circuit 102 of FIG. 1, a variable matching circuit 203 corresponds to the variable matching circuit 103 of FIG. 1, a capacitor C5 corresponds to the capacitor 104 of FIG. 1, and a transistor M1 corresponds to the transistor 106 of FIG. 1.

The configuration of the amplifier circuit 204 will be described. An n channel transistor M1 has a gate connected to an output terminal of an operational amplifier 208 via a resistor, a drain connected to a source of an n channel transistor M2, and a source connected to a ground. The n channel transistor M2 has a gate connected to a voltage Vg1 and a drain connected to a power supply voltage Vdd via an inductor L1. An input terminal IN is connected to the gate of the transistor M1 via the capacitor C5. An output terminal OUT is connected to the drain of the transistor M2. The capacitor C5 filters out direct-current components in input signals from the input terminal IN and supplies the filtered input signals to the gate of the transistor M1.

The configuration of the variable matching circuit 203 will be described. An n channel transistor M21 has a drain connected to the gate of the transistor M1 via a capacitor C1 and a source connected to the ground so that the transistor M21 constitutes a switch SW21. An n channel transistor M22 has a drain connected to the gate of the transistor M1 via a capacitor C2 and a source connected to the ground so that the transistor M22 constitutes a switch SW22. An n channel transistor M24 has a drain connected to the gate of the transistor M1 via a capacitor C4 and a source connected to the ground so that the transistor M24 constitutes a switch SW24. As described above, for example, four series-connected units composed of the capacitors C1 to C4 and switches SW21 to SW24 are connected in parallel.

The configuration of a gm-compensation circuit 201 will be described. An n channel transistor M6 has a gate and a drain connected to the power supply voltage Vdd via a current source CS3 and a source connected to the ground. An n channel transistor M5 has a gate connected to the current source CS3, a drain connected to the power supply voltage Vdd via a current source CS2 and a source connected to the ground via a resistor R3. An n channel transistor M11 has a drain connected to the power supply voltage Vdd via a current source CS11 and a resistor R1 and a source connected to the ground so that the transistor M11 constitutes a switch SW11. An n channel transistor M12 has a drain connected to the power supply voltage Vdd via a current source CS12 and the resistor R1 and a source connected to the ground so that the transistor M12 constitutes a switch SW12. An n channel transistor M14 has a drain connected to the power supply voltage Vdd via a current source CS14 and the resistor R1 and a source connected to the ground so that the transistor M14 constitutes a switch SW14. As described above, for example, four series-connected units composed of the current sources C11 to C14 and switches SW11 to SW14 are connected in parallel. The current sources CS3, CS2, CS11 to CS14 constitute a current mirror circuit 205 and current flows therein in a mutually dependent manner.

The configuration of the gate bias control circuit 202 will be described. An n channel transistor M3 has a gate connected to the output terminal of the operational amplifier 208, a drain connected to a source of an n channel transistor M4, and a source connected to the ground. The n channel transistor M4 has a gate connected to the voltage Vg1 and a drain connected to the power supply voltage Vdd via the resistor R2. The operational amplifier 208 has a noninverting input terminal connected to the drain of the transistor M4 and an inverting input terminal connected to the current sources CS11 to CS14. The current mirror circuit 206 has the transistors M1, M2, M3 and M4. Current flows in the transistors M1 in a mutually dependent manner and M3 and current flows in the transistors M2 and M4 in a mutually dependent manner.

The gain control circuit 207 controls gate voltages of the switches SW11 to SW1 and switches SW21 to SW24 to control the gain.

An operation of the variable matching circuit 203 will be described. The switches SW21 to SW24 are turned on when the gate voltage is in a high level to connect the respective capacitors C1 to C4 to the line between the gate of the transistor M1 and the ground. When more of the switches SW21 to SW24 are turned on, the capacitors C1 to C4 increases, the input impedance of the transistor M1 reduces, and accordingly, the gain is reduced.

An operation of the gm-compensation circuit 201 will be described. The gm of the transistor M1 changes according to temperature and process variations. The transistors M5, M6 in the gm-compensation circuit 201 have the same gm since those transistors M5, M6 have a transistor structure same as the transistor M1. The gm-compensation circuit 201 is a circuit to control to maintain the gm of the transistor M1 constant.

An operation of the gate bias control circuit 202 will be described. The switches SW11 to SW14 are turned on when the gate voltage is in a high level to connect the respective current sources CS11 to CS14. When fewer of the switches SW11 to SW14 are turned on, the current amount flowing through the resistor R1 reduces and the gate bias voltage of the transistor M1 is lowered. As a result, an input capacitor of the gate of the transistor M1 reduces, the input impedance of the transistor M1 increases, and this causes a reduction in the gain.

Figure 3:
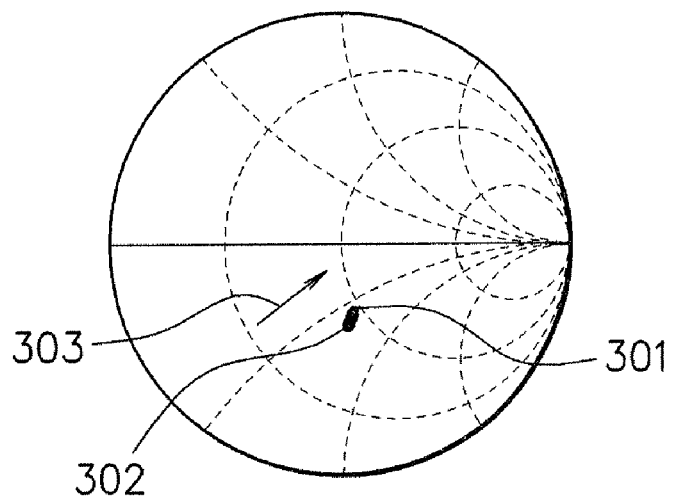
FIG. 3 is a Smith chart showing a change in an input impedance of a transistor when a gain is controlled by a gate bias control of a gate bias control circuit and a capacitor control of a variable matching circuit.
Figure 4:
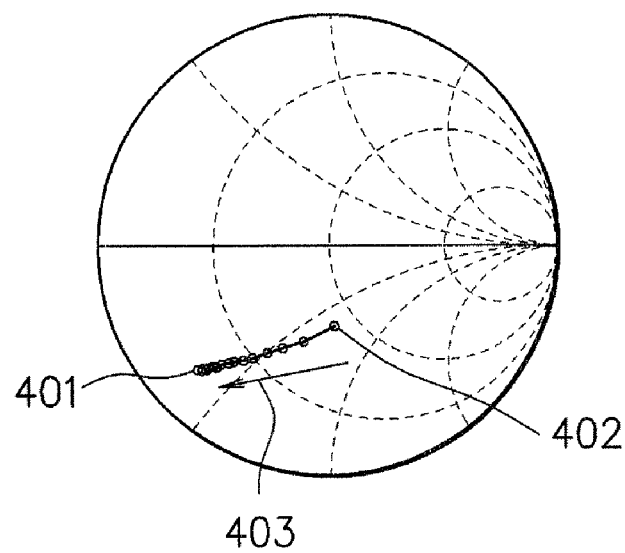
FIG. 4 is a Smith chart showing a change in the input impedance of the transistor when a gain is controlled only by the capacitor control of the variable matching circuit without the gate bias control of the gate bias control circuit.

FIGS. 3 and 4 are Smith charts showing results in simulations of input impedance variations of the transistor M1 corresponding to gain controls. The horizontal axis represents a resistor component. The left end is 0Ω, the right end is infinite value, and the middle is 50Ω. The upper part of the circle shows an inductance component and the lower part shows a capacitor component. It is assumed that the variable gain amplifier of the present embodiment is matched to 50Ω.

FIG. 4 is a Smith chart showing an input impedance variation of the transistor M1 when the gain is controlled only by the capacitor control of the variable matching circuit 203 without a gate bias control of the gate bias control circuit 202. When the gain is controlled starting at a point 402 where the gain is high and gradually shifted to a point 401 where the gain is low, the input impedance of the transistor M1 changes as indicated by the arrow 403. The variable matching circuit 203 can change the gain in a reducing direction from the point 402 to the point 401 by increasing the capacitors C1 to C4. In this case, the input impedance of the transistor M1 changed in a reducing direction as indicated by the arrow 403.

FIG. 3 is a Smith chart showing an input impedance variation of the transistor M1 when the gain is controlled by the gate bias control of the gate bias control circuit 202 and the capacitor control of the variable matching circuit 203. When the gain is controlled starting at the point 302 where the gain is high and gradually shifted to a point 301 where the gain is low, the input impedance of the transistor M1 hardly changes. In the case of FIG. 3, since the input impedance hardly changes, the input impedance can be kept almost constant, compared to the case of FIG. 4.

The gate bias control circuit 202 can change the gain in a reducing direction from the point 302 to the point 301 by reducing the gate bias. In this case, the input capacitor of the transistor M1 is reduced and its input impedance changes in an increasing direction.

As shown in FIG. 4, when the variable matching circuit 203 controls to reduce the gain, the input capacitor of the transistor M1 increases and the input impedance reduces. On the other hand, when the gate bias control circuit 202 controls to reduce the gain, the input capacitor of the transistor M1 reduces and the input impedance increases. When the gain is increased, the input capacitor and input impedance of the transistor M1 change in an opposite direction of the above case, in which the gain is reduced.

In other words, the change direction of the input impedance of the transistor M1 when the gate bias control circuit 202 controls the gate bias and the gain is reduced and the change direction of the input impedance of the transistor M1 when the variable matching circuit 203 controls the capacitor and the gain is reduced are opposite. Since those two changes of the input impedance are balanced out, the input impedance can be kept almost constant.

The gate bias control circuit 202 can reduce the gain by reducing the gate bias voltage of the transistor M1. In this case, the drain current in the transistor M1 reduces so that the power consumption can be reduced. On the other hand, the variable matching circuit 203 cannot control power consumption through the gain control. In order to reduce the gain, it is thus preferable to control the gate bias by the gate bias control circuit 202 to reduce the gain since the power consumption can also be reduced. Here, when the reduction range of the gain is small, the gain control can be sufficiently executed by only the gate bias control of the gate bias control circuit 20. However, when the reduction range of the gain is large, it is required controls of both the gate bias control circuit 202 and variable matching circuit 203 to control the gain.

That is, the gain of the amplifier circuit 204 is controlled by the gate bias control of the gate bias control circuit 202 or by the gate bias control of the gate bias control circuit 20 and the capacitor control of the variable matching circuit 203, according to the gain varying range of the amplifier circuit 204.

Concretely, the gain of the amplifier circuit 204 is controlled by the gate bias control of the gate bias control circuit 202 to control when the reduction range of the gain of the amplifier circuit 204 is smaller than a predetermined value and the gain of the amplifier circuit 204 is controlled by the gate bias control of the gate bias control circuit 202 and the capacitor control of the variable matching circuit 203 when the reduction range of the gain of the amplifier circuit 204 is greater than the predetermined value.

The variable gain amplifier of the present embodiment can be applied as an input unit of a single-phase circuit or a differential circuit in a power amplifier driver circuit. For example, the current source CS11 can apply current of 50 μA, the current source CS12 can apply current of 100 μA and the current source CS13 can apply current of 200 μA, and the current source CS14 can apply current of 400 μA, which are used in the gate bias control circuit 202. The current sources CS11 to CS14 are current sources provided in the current mirror circuit 205 of the gm-compensation circuit 201. Electric current values of the current sources CS11 to CS14 in the power supply circuit are controlled by switching the 4-bit switches SW11 to SW14. Using the current sources CS11 to CS14 and the current mirror circuit 206 connected to the operational amplifier 208, the gate bias point of the transistor M3 is controlled with a higher degree of accuracy. The gate bias voltage Vg1 of the transistor M4 can be applied by a resistance voltage division and the like. For example, the capacitor C1 used in the variable matching circuit 203 is 280 fF, the capacitor C2 is 560 fF, the capacitor C3 is 1120 fF and the capacitor C4 is 2240 fF. The capacitor C5 is 1120 fF. The gate length Lg of the transistors M21 to M24 is, for example, 0.24 μm. For example, the gate width Wg of the transistor M21 is 8 μm, the gate width Wg of the transistor M22 is 16 μm, the gate width Wg of the transistor M23 is 32 μm and the gate width Wg of the transistor M24 64 μm. The input impedance variations when the gain variable range is increased can be suppressed by switching on and off of the transistors M21 to M24. Further, the capacitor C5 employs a most preferable value as a part of matching circuit of a power amplifier driver. The switches SW11 to SW14 of the gate bias control circuit 202 and the gates of the switches SW21 to SW24 of the variable matching circuit 203 are connected to the gain control circuit 207. When the gain varying range is smaller than a predetermined gain variable range, a 4-bit control of the switches SW11 to SW14 is executed by using only the gate bias control circuit 202. Further, when the gain varying range is equal to or greater than the predetermined variable range, the input impedance is controlled not to change by using the 8 bits of the switches SW11 to SW14 and SW21 to SW24 of the gate bias control circuit 202 and variable matching circuit 203. FIG. 3 shows, as an example, a result of a simulation of a case in which the variable gain amplifier is used as an input unit of a differential circuit. As described above, the gain can be controlled by suppressing the variations of the input impedance. Using this variable gain amplifier suppresses a linear deterioration of an amplifier.

Second Embodiment

FIG. 5 is a circuit diagram showing a configuration of a variable gain amplifier according to a second embodiment of the present invention. Differences between FIG. 5 and FIG. 2 will be described. An input reflected power detector 501 detects an input reflected power of a transistor M1 and outputs the result to a terminal DOUT. A gain control circuit 207 executes an on/off control of switches SW11 to SW14 of a gate bias control circuit 202 and/or switches SW21 to SW24 of a variable matching circuit 203, according to the input reflected power of the terminal DOUT, which is output from the input reflected power detector 501.

The transistor M1 has a gate input terminal connected to a reflection detection circuit of the input reflected power detector 501 and the like and an output terminal DOUT is connected to the gain control circuit 207. The gain control circuit 207 compares an input reflected power before a gain control and an input reflected power after the gain control and calculates the difference. When the difference is smaller than a predetermined value, only 4 bits of switches SW11 to SW14 of the gate bias control circuit 202 are controlled. On the other hand, when the difference is equal to or greater than the predetermined value, the 8 bits of the switches SW11 to SW14 of the gate bias control circuit 202 and the switches SW21 to SW24 of the variable matching circuit 203 are controlled. In this control, the input impedance is controlled not to be changed.

The input reflected power is affected by the input impedance. It is thus controlled so that the input impedance after a gain control becomes the same as the input impedance before gain control by controlling the switches SW11 to SW14 and SW21 to SW24 and the difference between the input reflected power before the gain control and the input reflected power after the gain control is made small.

According to the present embodiment, a gate bias control of the gate bias control circuit 202 is executed, or a gate bias control of the gate bias control circuit 202 and a capacitor control of the variable matching circuit 203 are executed, corresponding to the input reflected power detected by the input reflected power detector 501. In other words, a control is executed by the gate bias control circuit 202 when the gain reduction range in the gain control is smaller than a predetermined value and controls are executed by the gate bias control circuit 202 and the variable matching circuit 203 when the gain reduction range is greater than the predetermined value. When the gain is reduced by a control of the gate bias control circuit 202, power consumption is reduced.

Concretely, a gate bias control of the gate bias control circuit 202 is executed when a difference between the input reflected power detected by the input reflected power detector 501 before a gain control and the input reflected power detected after the gain control is smaller than a predetermined value, and a gate bias control of the gate bias control circuit 202 and a capacitor control of the variable matching circuit 203 are executed when the difference is greater than the predetermined value.

Third Embodiment

Figure 6:
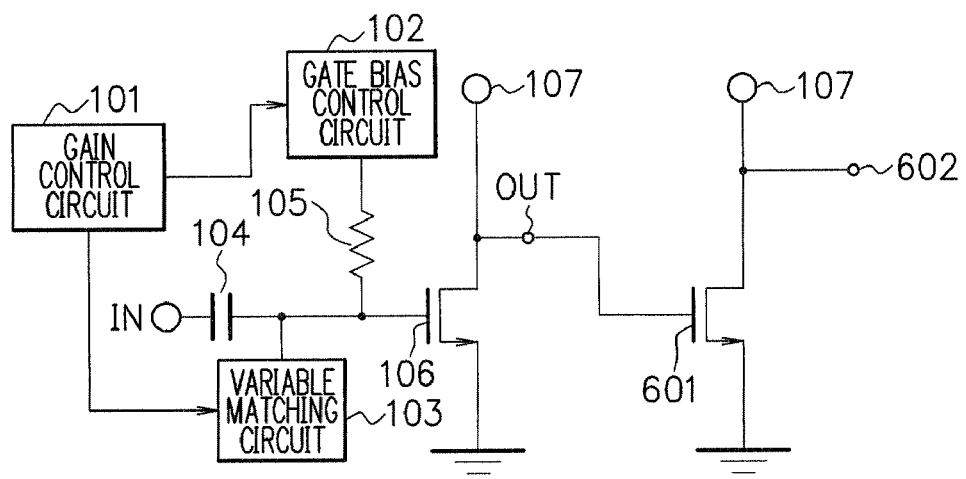
FIG. 6 is a circuit diagram showing a configuration of a variable gain amplifier according to a third embodiment of the present invention.
Figure 7:
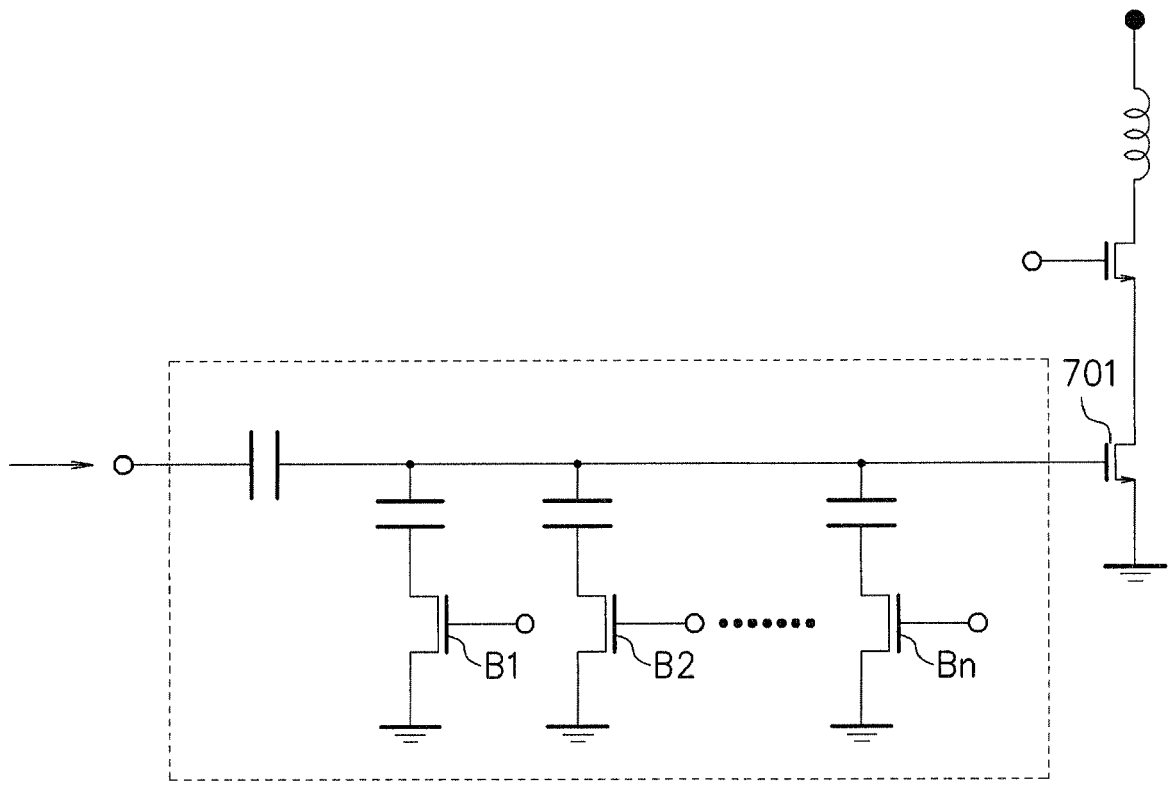
FIG. 7 is a circuit diagram of a gain controllable high-frequency amplifier circuit.

FIG. 6 is a circuit diagram showing a configuration of a variable gain amplifier according to a third embodiment of the present invention. Differences between FIG. 6 and FIG. 1 will be described. An n channel transistor 601 has a gate connected to a terminal OUT, a drain connected to a power supply voltage terminal 107 and a source connected to a ground terminal. An output terminal 602 is connected to the drain of the transistor 601.

The transistor 601 constitutes a fixed gain amplifier circuit connected to a subsequent stage of the amplifier circuit of FIG. 1 and amplifies signals input to the gate of the transistor 601 to output from the terminal 602. The fixed gain amplifier circuit does not include a gate bias control circuit or a variable matching circuit and does not control the gate bias the transistor 601 or the capacitor connected to the gate. As described in the present embodiment, when a variable gain amplifier is composed of a plurality of amplifier circuits, it is preferable that at least one of the circuits is a variable gain amplifier circuit of FIG. 1 but other circuits can be fixed gain amplifier circuits.

As described above, according to the first to third embodiments, the variable gain amplifier has a gate bias control circuit 102, a variable matching circuit 103, and a gain control circuit 101 controlling the circuits 102, 103, as shown in FIG. 1. The gate bias control circuit 102 controls a gain when a gain control range is smaller than a predetermined gain control range. The variable matching circuit 103 and gate bias control circuit 102 are associated to control the gain when the gain control range is greater than the predetermined gain control.

According to the above variable gain amplifier, since resistor elements or switches are not inserted in a propagation path of high frequency input signals between the input terminal IN and the gate of amplifier transistor M1, there are none of noise figure deteriorations caused by resistor elements, parasitic capacitance problems, or high-frequency characteristic deteriorations caused by switches.

Further, since the changes in the input impedance during a gain control are small, matching with a previous circuit of the variable gain amplifier can be maintained. This allows the variable gain amplifier suppress linear deterioration in a wide gain control range. Also, power consumption can be suppressed since the gain is controlled by controlling the gate bias control circuit 102 and variable matching circuit 103.

As a result, the gain can be controlled in a wide range with low power consumption while reducing the noise figure deterioration in high-frequency signals and suppressing linear deteriorations of a variable gain amplifier.

It is noted that the above described embodiments are detailed examples to implement the present invention and the technical scope of the present invention should not be limited by the descriptions. That is, various modifications and changes can be made within the technical idea and characteristics of the present invention.

INDUSTRIAL APPLICABILITY

Variations in an input impedance can be prevented by controlling a gain with an association of a control of a gate bias of a first amplifier circuit and a control of a capacitor connected to a gate. In addition, because of the gate bias control, power consumption can be lowered.

What is claimed is:

1. A variable gain amplifier comprising:
   a first amplifier circuit having a first field-effect transistor and amplifying a signal input to a gate of the first field-effect transistor;
   a gate bias control circuit controlling a gate bias of said first amplifier circuit to control a gain of said first amplifier circuit; and
   a variable matching circuit controlling a capacitor connected to the gate of said first amplifier circuit to control the gain of said first amplifier circuit,
   wherein the gain of said first amplifier circuit is controlled by the gate bias control of said gate bias control circuit when a reduction range in the gain of said first amplifier circuit is smaller than a value, and the gain of said first amplifier circuit is controlled by the gate bias control of said gate bias control circuit and the capacitor control of said variable matching circuit when the reduction range in the gain of said first amplifier circuit is greater than the value.

2. The variable gain amplifier according to claim 1, wherein the gain of said first amplifier circuit is controlled by the gate bias control of said gate bias control circuit or by the gate bias control of said gate bias control circuit and the capacitor control of said variable matching circuit, according to a gain varying range of said first amplifier circuit.

3. The variable gain amplifier according to claim 1, further comprising:
   a gain control circuit that supplies a first control signal for controlling the gate bias to the gate bias control circuit and a second control signal for controlling the capacitor to the variable matching circuit.

4. The variable gain amplifier according to claim 1, further comprising:
   a reflection detection circuit detecting an input reflected power of said first amplifier circuit,
   wherein the gate bias control of said gate bias control circuit and/or the capacitor control of said variable matching circuit is executed according to an input reflected power detected by said reflection detection circuit.

5. The variable gain amplifier according to claim 4, wherein the gate bias control of said gate bias control circuit is executed or the gate bias control of said gate bias control circuit and the capacitor control of said variable matching circuit are executed, according to the input reflected power detected by said reflection detection circuit.

6. The variable gain amplifier according to claim 5, wherein the gate bias control of said gate bias control circuit is executed when a difference between an input reflected power detected by said reflection detection circuit before a gain control and an input reflected power detected after the gain control is smaller than a specified value, and the gate bias control of said gate bias control circuit and the capacitor control of said variable matching circuit are executed when the difference is greater than the specified value.

7. The variable gain amplifier according to claim 1, further comprising:
   a second amplifier circuit connected to said first amplifier circuit and having a second field-effect transistor, said second amplifier circuit not executing a control of a gate bias of the second field-effect transistor and a control of a capacitor connected to the gate, and said second amplifier circuit amplifying a signal input to the gate of the second field-effect transistor to output.

8. The variable gain amplifier according to claim 1, wherein a change direction of an input impedance of said first amplifier circuit when the gain is reduced by controlling the gate bias of said first amplifier circuit and a change direction of an input impedance of said first amplifier circuit when the gain is reduced by controlling the capacitor of said variable matching circuit are opposite to each other.

9. The variable gain amplifier according to claim 8, wherein the input impedance of said first amplifier circuit increases when the gain is reduced by the gate bias control of said gate bias control circuit, and the input impedance of said first amplifier circuit reduces when the gain is reduced by the capacitor control of said variable matching circuit.

10. The variable gain amplifier according to claim 1, wherein said gate bias control circuit reduces the gate bias to reduce the gain of said first amplifier circuit, and said variable matching circuit increases the capacitor to reduce the gain of said first amplifier circuit.

11. A variable gain amplifier control method controlling a variable gain amplifier, which comprises a first amplifier circuit having a first field-effect transistor and amplifies a signal input to a gate of the first field-effect transistor, the method comprising:
controlling a gate bias of the first amplifier circuit to control a gain of the first amplifier circuit; and
controlling a capacitor connected to the gate of the first amplifier circuit to control the gain of the first amplifier circuit,
wherein the gain of the first amplifier circuit is controlled by controlling the gate bias when a reduction range in the gain of the first amplifier circuit is smaller than a value, and the gain of the first amplifier circuit is controlled by controlling the gate bias and capacitor when the reduction range in the gain of the first amplifier circuit is greater than the value.

12. The variable gain amplifier control method according to claim 11, wherein the gain of the first amplifier circuit is controlled by controlling the gate bias or by controlling the gate bias and capacitor, according to a gain varying range of the first amplifier circuit.

13. The variable gain amplifier control method according to claim 11, further comprising:
controlling the gate bias based on a first control signal; and
controlling the capacitor based on a second control signal.

14. The variable gain amplifier control method according to claim 11, further comprising:
detecting an input reflected power of the first amplifier circuit,
wherein the gate bias and/or the capacitor is controlled according to the detected input reflected power.

15. The variable gain amplifier control method according to claim 14, wherein the gate bias is controlled or the gate bias and capacitor are controlled, according to the detected input reflected power.

16. The variable gain amplifier control method according to claim 15, wherein the gate bias is controlled when a difference between an input reflected power detected before a gain control and an input reflected power detected after the gain control is smaller than a specified value, and the gate bias and capacitor are controlled when the difference is greater than the specified value.

17. The variable gain amplifier control method according to claim 11, wherein the variable gain amplifier further comprises a second amplifier circuit connected to the first amplifier circuit and having a second field-effect transistor, the second amplifier circuit does not execute a control of a gate bias of the second field-effect transistor and a control of a capacitor connected to the gate, and the second amplifier circuit amplifies a signal input to the gate of the second field-effect transistor to output.

18. The variable gain amplifier control method according to claim 11, wherein a change direction of an input impedance of the first amplifier circuit when the gain is reduced by controlling the gate bias and a change direction of an input impedance of the first amplifier circuit when the gain is reduced by controlling the capacitor are opposite to each other.

19. The variable gain amplifier control method according to claim 18, wherein the input impedance of the first amplifier circuit increases when the gain is reduced by controlling the gate bias, and the input impedance of the first amplifier circuit reduces when the gain is reduced by controlling the capacitor.

20. The variable gain amplifier control method according to claim 11, wherein the gate bias control reduces the gate bias to reduce the gain of the first amplifier circuit, and the capacitor control increases the capacitor to reduce the gain of the first amplifier circuit.

* * * * *